US007599176B1

(12) United States Patent
Moisson (10) Patent No.: US 7,599,176 B1
(45) Date of Patent: Oct. 6, 2009

(54) APPARATUS FOR PROVIDING VISUAL INDICATION OF ENGAGEMENT OF A DRIVE RECEIVED WITHIN A DRIVE CAGE

(75) Inventor: Marc Moisson, Los Altos, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 559 days.

(21) Appl. No.: 10/404,514

(22) Filed: Apr. 1, 2003

Related U.S. Application Data (60) Provisional application No. 60/370,864, filed on Apr. 8, 2002.

(51) Int. Cl.
*H05K 7/20* (2006.01)
(52) U.S. Cl. .............................. 361/679.37; 361/679.33; 361/679.38; 361/725; 361/727; 312/223.2
(58) Field of Classification Search .................. 361/685
See application file for complete search history.

(56) References Cited

U.S. PATENT DOCUMENTS

| | | | | | |
|---|---|---|---|---|---|
| 2,216,480 | A | * | 10/1940 | Severy ................... 292/256.69 |
| 3,177,404 | A | * | 4/1965 | Patmore ...................... 361/683 |
| 5,126,890 | A | * | 6/1992 | Wade et al. .................... 360/60 |
| 5,220,713 | A | * | 6/1993 | Lane et al. ..................... 24/628 |
| 5,347,248 | A | * | 9/1994 | Herbert ......................... 335/18 |
| 5,378,184 | A | * | 1/1995 | Bro et al. ...................... 446/99 |
| 5,380,067 | A | * | 1/1995 | Turvill et al. ................ 297/484 |
| 5,436,735 | A | * | 7/1995 | Tanabe et al. ................ 358/453 |
| 5,474,463 | A | * | 12/1995 | Robinson et al. ............. 439/159 |
| 5,557,499 | A | * | 9/1996 | Reiter et al. ................. 361/685 |
| 5,575,529 | A | * | 11/1996 | Dowdy et al. ............. 312/223.2 |
| 5,641,306 | A | * | 6/1997 | Stepniak ...................... 439/491 |
| 5,668,697 | A | * | 9/1997 | Dowdy ........................ 361/685 |
| 5,732,464 | A | * | 3/1998 | Lamont ......................... 29/825 |
| 5,790,373 | A | * | 8/1998 | Kim et al. .................... 361/685 |
| 5,969,256 | A | * | 10/1999 | Hobbs .......................... 73/663 |
| 6,052,278 | A | * | 4/2000 | Tanzer et al. ................. 361/685 |
| 6,178,359 | B1 | * | 1/2001 | Dobyns ....................... 700/117 |
| 6,325,353 | B1 | * | 12/2001 | Jiang ........................... 248/682 |
| 6,359,836 | B1 | * | 3/2002 | Sevier et al. ................. 361/725 |
| 6,450,597 | B1 | * | 9/2002 | Bell et al. ................. 312/223.1 |
| 6,597,577 | B1 | * | 7/2003 | Tang et al. ................... 361/724 |
| 2002/0039528 | A1 | * | 4/2002 | Kato et al. ............... 415/182.1 |
| 2002/0095007 | A1 | * | 7/2002 | Larock et al. ............... 524/310 |
| 2002/0164896 | A1 | * | 11/2002 | Borgstrom et al. .......... 439/183 |
| 2002/0167792 | A1 | * | 11/2002 | Osterhout et al. ........... 361/685 |
| 2003/0039074 | A1 | * | 2/2003 | Erpelding ................ 360/244.2 |
| 2006/0004337 | A1 | * | 1/2006 | Datta .................... 604/385.01 |

* cited by examiner

*Primary Examiner*—Jayprakash N Gandhi
*Assistant Examiner*—Anthony Q Edwards
(74) *Attorney, Agent, or Firm*—Suiter Swantz pc llo (57) ABSTRACT

An apparatus for providing the visual indication of engagement of a drive received within a drive cage includes an indicator attached to a carrier mounted on a drive received within, a drive cage. The drive cage may be a redundant array of independent disks storage shelf and the drive may be a hard disc drive suitable for being received in the drive cage. Further, the indicator may be attached to at least one of the drive and the drive cage and provides visual indication of when the drive is properly seated in the drive cage. The indicator is at least one of a contrasting color, symbol, pattern, portrait and the like, to what it is attached to.

26 Claims, 8 Drawing Sheets

APPARATUS FOR PROVIDING VISUAL INDICATION OF ENGAGEMENT OF A DRIVE RECEIVED WITHIN A DRIVE CAGE

CROSS REFERENCE TO RELATED APPLICATION

The present application claims priority under 35 U.S.C. §119 to U.S. Provisional Application Ser. No. 60/370,864 filed Apr. 8, 2002, which is herein incorporated by reference in its entirety.

FIELD OF THE INVENTION

The present invention generally relates to the field of storage system enclosures and particularly to an apparatus for providing visual indication of engagement of a drive received within a drive cage, such as a hard disk drive within a redundant array of independent disks storage shelf, or the like.

BACKGROUND OF THE INVENTION

Though storage system enclosures may become more and more powerful, users are demanding a higher level of "user friendliness". For instance, components of storage system enclosures may be mounted with a carrier to make transporting them easier. Aesthetically pleasing color schemes have had a significant impact upon these systems. This coloring has positively impacted the sales of these systems but has produced some negative results as well. In particular when identically colored components (e.g., hard disk drive, and the like) are located within a drive cage such as a redundant array of independent disks (RAID) storage shelf, and the like, verifying that an individual drive is properly seated in the drive cage may be problematic. Ensuring that individual components of such storage system enclosures stay correctly seated, in order to maintain their productivity, may become even more troublesome as consumers and users continue to decrease the physical space they are willing to give to the storage system enclosure and increase the number of components. It may be useful to enable a simpler way of identifying improperly seated drives.

The solutions that have been formulated so far use additional components or circuits to detect the seating position of the drive. For instance, in a RAID storage shelf the controller assembly (e.g., filer head) may be responsible for monitoring the seating of individual drives through the ability to communicate with them. This may require additional processors be added to the control assembly specifically designed for detecting drive seating positions using additional interface points. Further, the circuits may require additional circuit boards and connections be added to the control assembly to accomplish the task. These solutions add cost and complexity to storage systems and create additional problems such as system failure and false alarms. Further, these solutions may not identify to the user a particular individual drive is not properly seated, thereby merely providing an indication that user communication with the storage system is not available. Thus, the user may be asked to spend considerable time and effort in order to identify the incorrectly seated individual drive.

Therefore, it would be desirable to have an apparatus, which provides a visual indication of engagement of a drive received within a drive cage so as to enable a user to identify an incorrectly seated drive, so that they may quickly and easily remedy the situation.

SUMMARY OF THE INVENTION

Providing an easy and reliable way for an operator to identify an improperly seated drive, without adding significant cost or complexity to the storage system enclosure is paramount. The attachment or integration of an indicator directly to the drive, the drive cage or the carrier mounted to the drive may provide an operator of the storage system enclosure a simple, low-tech, low-cost method for identifying an improperly seated drive. The drive, whether attached with a carrier or not, has a seated position which indicates that it has been correctly engaged with the drive cage. This allows for communication between the drive and the drive cage, usually through a drive cage controller. Communication may be enabled with an operator who is attempting to utilize the drive through an information handling system interfaced with the drive cage controller. The indicator is of a contrasting color to what it is attached to or integrated with and may be visually ascertainable when the drive is not properly seated in the drive cage and, thus, not correctly engaged.

Accordingly, the present invention is directed to an apparatus for providing a visual indication of engagement of a drive seated within a drive cage. In an exemplary embodiment of the present invention, an apparatus suitable for indicating whether a drive is properly seated in a drive cage includes, a carrier attached to the drive and an indicator attached to at least one of the drive, drive cage and the carrier. The indicator provides a visual indication that the drive is properly seated in and engaged with the drive cage. An operator may visually ascertain the indicator when the drive is not properly seated in the drive cage and, thus, an operator would not see the indicator when the drive is properly seated.

In another exemplary embodiment of the present invention, a drive assembly includes a drive suitable for being received in a drive cage. The drive assembly includes an indicator, which is attached to at least one of the drive and the drive cage, for indicating when the drive is properly seated in the drive cage. The indicator provides a visual indication that the drive is properly seated in the drive cage.

In another exemplary embodiment of the present invention, a drive assembly includes a drive cage suitable for receiving a drive. The drive assembly includes an indicator, which is attached to at least one of the drive and the drive cage, for indicating when the drive is properly seated in the drive cage. The indicator provides a visual indication that the drive is properly seated in the drive cage.

In another exemplary embodiment of the present invention, a drive assembly includes a drive cage, a drive and an indicator. The drive is suitable for being received in the drive cage. The indicator is attached to at least one of the drive and the drive cage and indicates when the drive is properly seated in the drive cage. The indicator provides a visual indication that the drive is properly seated in the drive cage. Further, a first communication port adapter is included on the drive cage and a second communication port adapter is included on the drive. The first and second communication port adapters are capable of mechanically coupling, which allows communication between the drive and the drive cage. The mechanical coupling of the first and second communication port adapters indicates the correct engagement of the drive within the drive cage.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1A:
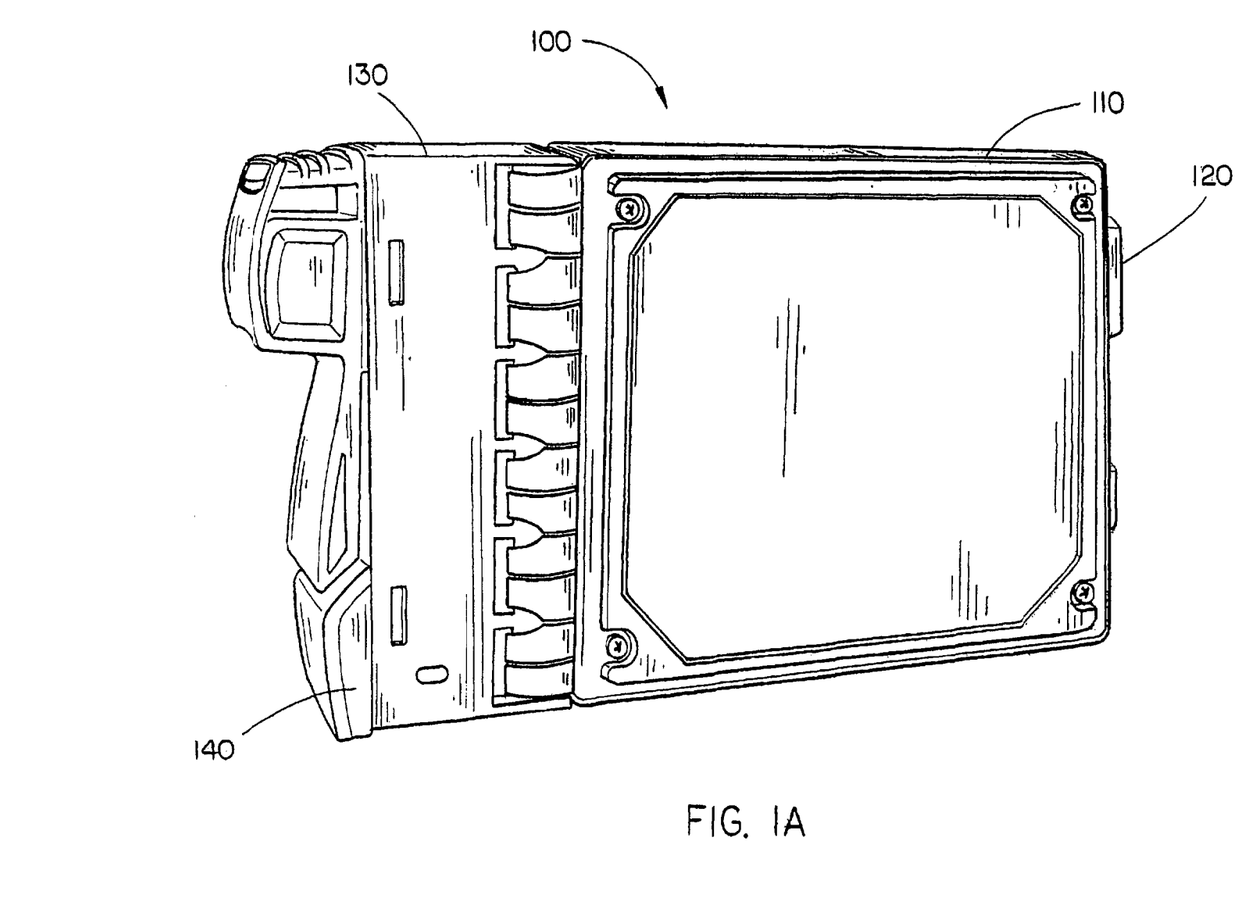
FIG. 1A is an isometric view illustrating a right-lateral view of an exemplary embodiment of the present invention wherein an indicator is attached to or integrated with a carrier mounted on a hard disc drive with a communication port adapter.
Figure 1B:
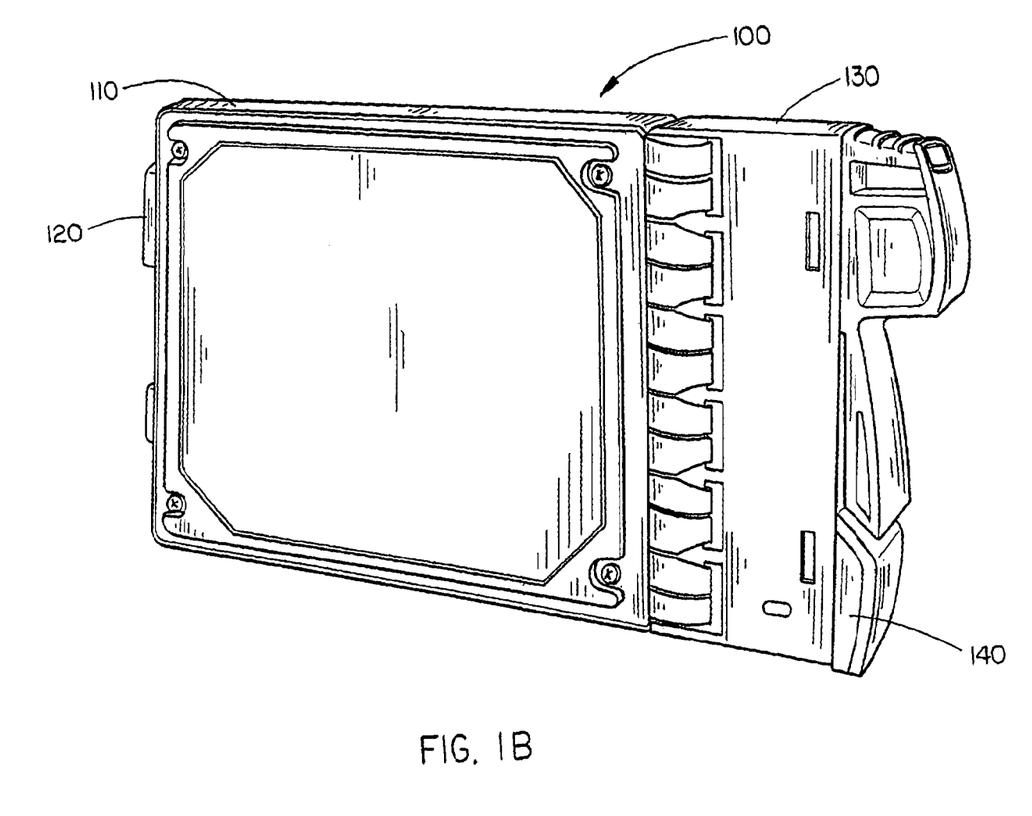
FIG. 1B is an isometric view illustrating a left-lateral view of an exemplary embodiment of the present invention wherein an indicator is attached to or integrated with a carrier mounted on a hard disc drive with a communication port adapter.
Figure 1C:
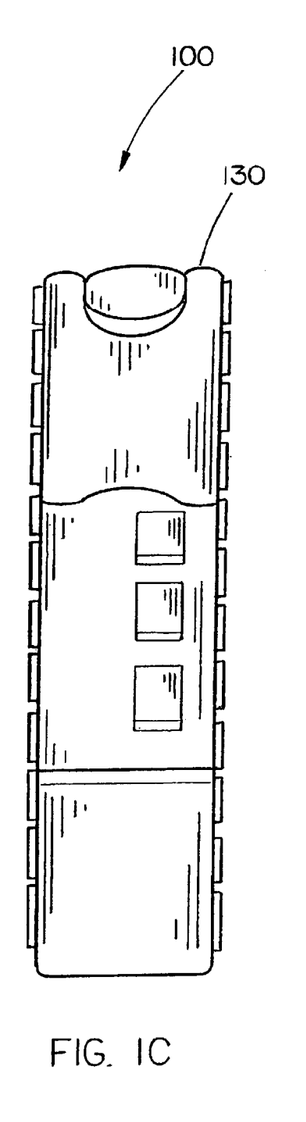
FIG. 1C is a front plan view illustrating an exemplary embodiment of the present invention wherein the carrier is mounted on the hard disc drive.
Figure 1D:
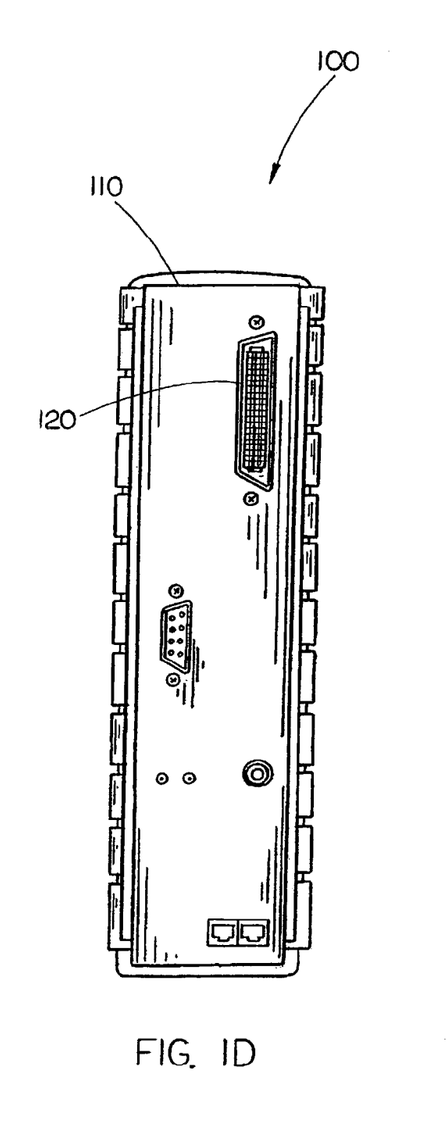
FIG. 1D is a back plan view illustrating the hard disc drive with a communication port adapter.

FIGS. 1A through 1D illustrate a removable hard disk drive carrier assembly (RDA) 100. Removable hard disk drive carrier assembly 100 includes a hard disk drive 110 mounted with a removable carrier 130 to which an indicator 140 is attached. FIG. 1D shows the back side of hard disk drive 110 which includes a communication port adapter 120. RDA 100 is properly seated when communication port adapter 120 couples with a communication port adapter, such as communication port adapter 320, shown and described in FIG. 3, thus correctly engaging RDA 100 with a RAID storage shelf, such as the RAID storage shelf 310 shown and described in FIG. 3. This allows for communication between RDA 100 and an operator of an information handling system interfaced with the RAID storage shelf.

Indicator 140, a "flag" externally attached to or integrated with carrier 130, hard disk drive 110 or the RAID storage shelf, provides visual indication whether RDA 100 is properly seated or whether RDA 100 is improperly seated within the RAID storage shelf. This "flag" is of a contrasting color to carrier 130, hard disk drive 110 or the RAID storage shelf to which it is attached to or integrated with and its size can be correlated with a RAID storage shelf "throw" lever so that the width of the indicator, at its widest point, corresponds to the length of linear travel imparted through the use of the throw lever. Indicator 140 does not increase the potential for system faults or failures because it does not require additional components or circuitry and the cost of adding such a "flag", to any device, will be nominal. Further, through visual ascertainment an operator can quickly and easily identify if an RDA 100 unit is or is not properly seated enabling efficient resolution of any problems. This is a marked improvement over previous indication systems, which may only provide general system failure indications to an operator while not indicating which component is the problem.

In the exemplary embodiment shown, the hard disk drive 110 comprises a drive that may be found in a RAID storage system. The generally rectangular enclosure of the hard disk drive allows it to be seated within the RAID storage shelf. The housing of the hard disk drive 110 includes a front side capable of being mounted with a removable carrier 130 and a back side, opposite of the front side, which includes communication port adapter 120. The top side and bottom side provide housing with no interface points, fastener points or other structures as may be contemplated by one of ordinary skill in the art. The right side and left side provide the housing at least one fastener point on each side. Four fasteners, on each side, are inserted within the four fastener points, shown in this embodiment, and hold the housing together. The right and left sides include a raised face structure, which at its corners surrounds the four fastener points with fasteners inserted on three sides and internally has an octahedral shape. When seated the top, back and bottom sides are physically engaged with the RAID storage shelf while the right and left sides face other hard disk drives or the RAID storage shelf wall within the shelf. The hard disk drive 110 is a non-volatile storage device. The internal structure comprises component and circuit configuration of a standard non-volatile storage device.

It is contemplated that other hard drives and chassis configurations may be provided which enable seating within a variety of RAID storage shelf structures and styles. Moreover, the physical dimensions of the housing may be changed from those depicted without departing from the spirit and scope of the present invention. It is further contemplated that the hard disk drive 110 may be used in a multiplicity of storage system enclosures such as just a bunch of disks (JBOD).

The material of the housing structure of the hard disk drive 110 may include steel, aluminum, hardened and heat resistant polycarbonate and the like. The back side of the housing structure may include a power adapter, modem ports, universal serial bus ports and the like. Interface ports, such as those described, may be located on other sides of the housing as may be contemplated by one of ordinary skill in the art. The fasteners may be screws, pins, plugs, and the like, made out of plastic, steel, aluminum and the like. Further, the drive may include high profile hard disk drives (HHDD), low profile hard disk drives (LPHDD), magnetic disk or tape, an optical storage device such as CD-ROM (compact disk-ROM), CD-R (CD-recordable), DVD (digital versatile disk), a magneto-optical (MO) device, a semiconductor based memory system, and the like.

Figure 2:
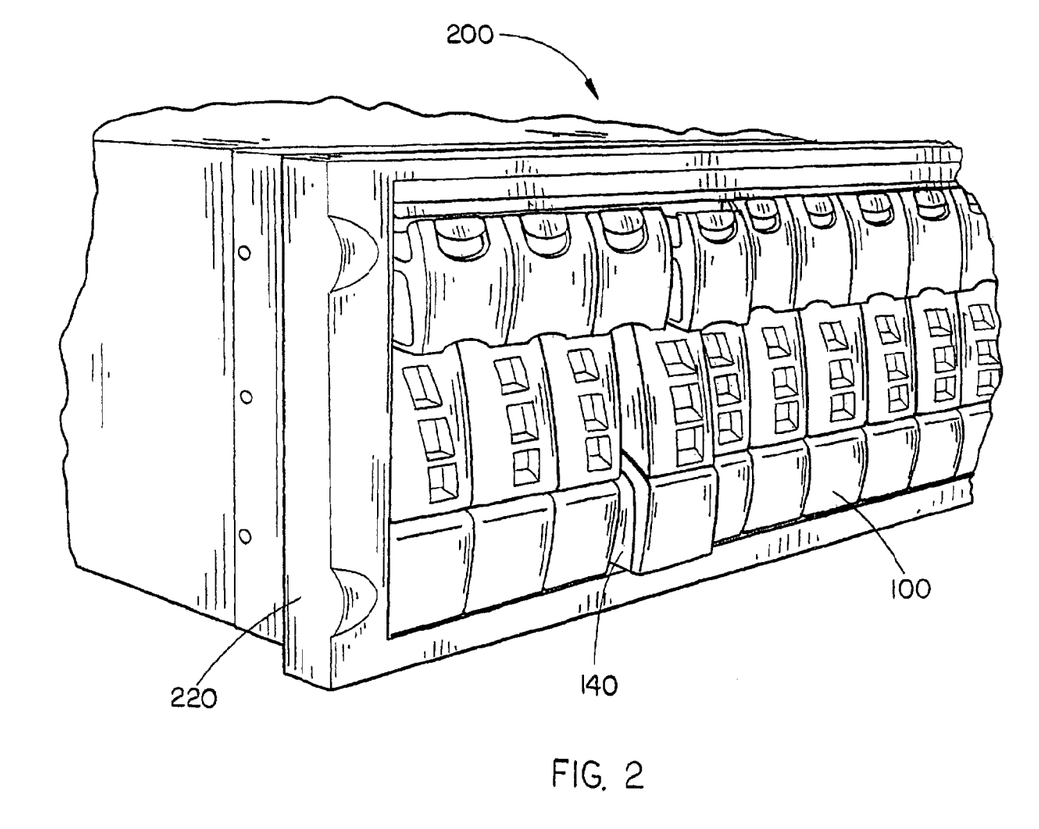
FIG. 2 is an isometric view illustrating an exemplary embodiment of the present invention wherein a RAID storage shelf system is shown consisting of the removable hard disc drive carrier assembly (RDA) of FIGS. 1A-1D, with one improperly seated within the RAID storage shelf, is shown.

The communication port adapter 120 may be a parallel port, special connector, and the like, allowing for the mechanical coupling of the hard disk drive 110 with a drive cage (such as drive cage 220 shown in FIG. 2). It will be appreciated by one of ordinary skill in the art that other communication port adapters may be substituted for those specifically described herein without departing from the scope and spirit of the invention. This communication port adapter may provide for the mechanical and communicative coupling between hard disk drive 110, a drive cage (such as drive cage 220 shown in FIG. 2) and peripheral devices that may access hard disk drive 110 through various systems such as direct attached storage systems, network attached storage systems, storage area network systems and the like. This allows users of the peripheral devices to access information stored on hard disk drive 110 such as network information, applications, databases and the like.

The present embodiment shows the communication port adapter located on the back side of hard disk drive 110, however, the communication port adapter may be located in a variety of positions as contemplated by normal usage and persons of ordinary skill in the art. Communication may be accomplished using SCSI (small computer systems interface), serial SCSI, Fiber Channel or ESCON (enterprise system connection) protocols depending on the system specifications.

Removable carrier 130 may allow one carrier to be interchanged with other devices as contemplated by one of ordinary skill in the art. Further, removable carrier 130 allows for easy accessibility and replacement in the case of a drive failure while the system remains operational. This ability is often referred to as a "Hot Swapping" drive and minimizes down time and system failures. Removable carrier 130 is composed of material of a single color, however, it may be composed of a combination of colors as contemplated by one of ordinary skill in the art. The general shape of removable carrier 130 is that of a rectangular box, which matches the physical characteristics of the hard drive. Removable carrier 130 includes a front portion, made up of a very hard, non-transparent, plastic material that has an exposed front side, top side, right side, left side and bottom side as well as an unexposed back side. Further, removable carrier 130 includes a back portion composed of steel that has an unexposed front side and back side as well as an exposed top side, bottom side, right side, and left side. The front portion unexposed backside is coupled with the back portion unexposed front side. The exposed front side of the front portion is shaped for aesthetic reasons and includes an upper area, which consists of a handle, a middle area, which includes three contoured regions and a contoured lower area. The exposed front side provides protection to the hard disk drive 110 and, by use of the handle, means for transporting the hard disk drive 110. The back portion's exposed right side and left side includes multiple connectors, these connectors are made of steel and serve to fasten the carrier to the hard disk drive 110. The back portion's unexposed back side is mounted upon the hard disk drive 110. Removable carrier 130 is exemplary, representative of the type and location of device, which may be disposed on the hard disk drive 110.

Removable carrier 130 and connectors may be composed of a variety of very tactile materials such as steel, aluminum, plastic and the like. The front portion of removable carrier 130 may be translucent in internal structure. Removable carrier 130 may facilitate engagement of the hard disk drive 110 to avoid any unnecessary torsion or torque. Further, removable carrier 130 may be composed of tactile magnesium, which also helps in reducing vibration transfer to the hard disk drive. The color of removable carrier 130 may be any color so long as it is contrasting with indicator 140 as described and discussed below. If the front portion of the removable carrier 130 were translucent it may provide for a method of indication where indicator 140 may not be attached to removable carrier 130. As with the hard disk drive 110, there may be a myriad of carrier styles and chassis configurations, which may enable connection with and mounting upon a variety of hard disk drive structures and styles. It may be contemplated by one of ordinary skill in the art that the physical dimensions of the carrier be changed without departing from the spirit and scope of the present invention. It is contemplated that removable carrier 130 may be used in a multiplicity of storage systems such as the RAID storage shelf, JBOD and the like.

In the preferred embodiment shown, indicator 140 is a flag having a shape which mimics the contours and shape of the right and left side of the lower area of the exposed front side of the front portion of removable carrier 130. The widest point of indicator 140 matches the length of linear travel of RDA 100 within a RAID storage shelf as shown and discussed in FIG. 2. Indicator 140 is located on the right and left side of the lower area of the exposed front side of the front portion of removable carrier 130. The color of indicator 140 is one that contrasts with the color of the front portion of removable carrier 130. For example, if carrier 130 were grayish or white a red or orange color may be used for indicator 140. Further, indicator 140 may be a pattern such as stripes, plaid, and the like, or symbols and pictures such as dots, boxes, asterisks, portraits and the like. Indicator 140 has been applied through a process of printing, painting or adhering, as such the indicator may be attached to or integrated with the carrier. The indicator does not protrude out from its location but lays flush with the side of the carrier. Indicator 140 is visually ascertainable when the RDA 100 is improperly seated within a RAID storage shelf (shown in FIG. 2) as will be shown in FIGS. 5A and 5B and is not visually ascertainable upon proper seating as will be shown in FIGS. 6A and 6B.

Indicator 140 may be of any size, design or material as contemplated by one of ordinary skill in the art or necessitated by the specific system being used. The indicator may be attached to or integrated with any device including the hard disk drive 110 or the RAID storage shelf (shown in FIG. 2). The indicator may protrude out or occupy some physical space of its own if necessary to provide proper indication. Preferably indicator 140 is of a contrasting color to what it is attached to but may be any color as long as it is visually ascertainable by a user upon the improper seating of a device. The indicator may be attached by means of printing, painting, adhering and the like. The location may be as shown in the current embodiment or another location which provides equivalent visual field ascertainment capabilities when the hard disk drive 110 is improperly seated within the drive cage as may be contemplated by one of ordinary skill in the art.

It is contemplated that the indicator may be attached to the drive cage (such as RAID storage shelf 220 shown in FIG. 2) in such a manner as would enable visual indication of the proper seating of the RDA 100 within the drive cage. Carrier 130 may be of a translucent internal structure allowing a user to see through it an visually ascertain the indicator. The indicator may be attached through the same methods as discussed above and be of a contrasting color to the drive cage. The indicator may be visually ascertainable by an operator when the RDA 100 is not properly seated and engaged within the disk cage. Other methods of visual indication such as visual ascertainment upon proper seating and the like may be substituted for the present description without departing from the spirit and scope of the present invention.

FIG. 2, an exemplary drive assembly, comprising a RAID storage shelf system, is shown. This embodiment of the present invention illustrates a drive assembly 200, which includes a plurality of RDA 100 units received within a RAID storage shelf 220. The RAID storage shelf is a generally rectangular box having an open side, which is of sufficient size to receive within RDA 100. It is recognized, from the current illustration, that when RDA 100 is received within the RAID storage shelf 220, through the open side, it may be properly seated or improperly seated but still considered physically received within. When improperly seated indicator 140 is exposed and visually ascertainable while when properly seated indicator 140 is not visually ascertainable. Further, the RAID storage shelf 220 has a frame attached around the edges of the open side. The frame has a front molded plastic portion and a back steel portion which contains multiple fastener points. The other sides include multiple fastener points, which correspond with the multiple fastener points contained on the frame. Through the use of fasteners inserted within the corresponding multiple fastener points the frame is attached to the RAID storage shelf 220. The color of the molded plastic, in the current embodiment, is substantially the same as the color of the removable carrier 130 (as described in FIGS. 1A-1D). The RAID storage shelf is of sufficient structural rigidity to enable it to lie horizontally on a surface and not expose RDA 100 to intolerable compression.

Figure 4:
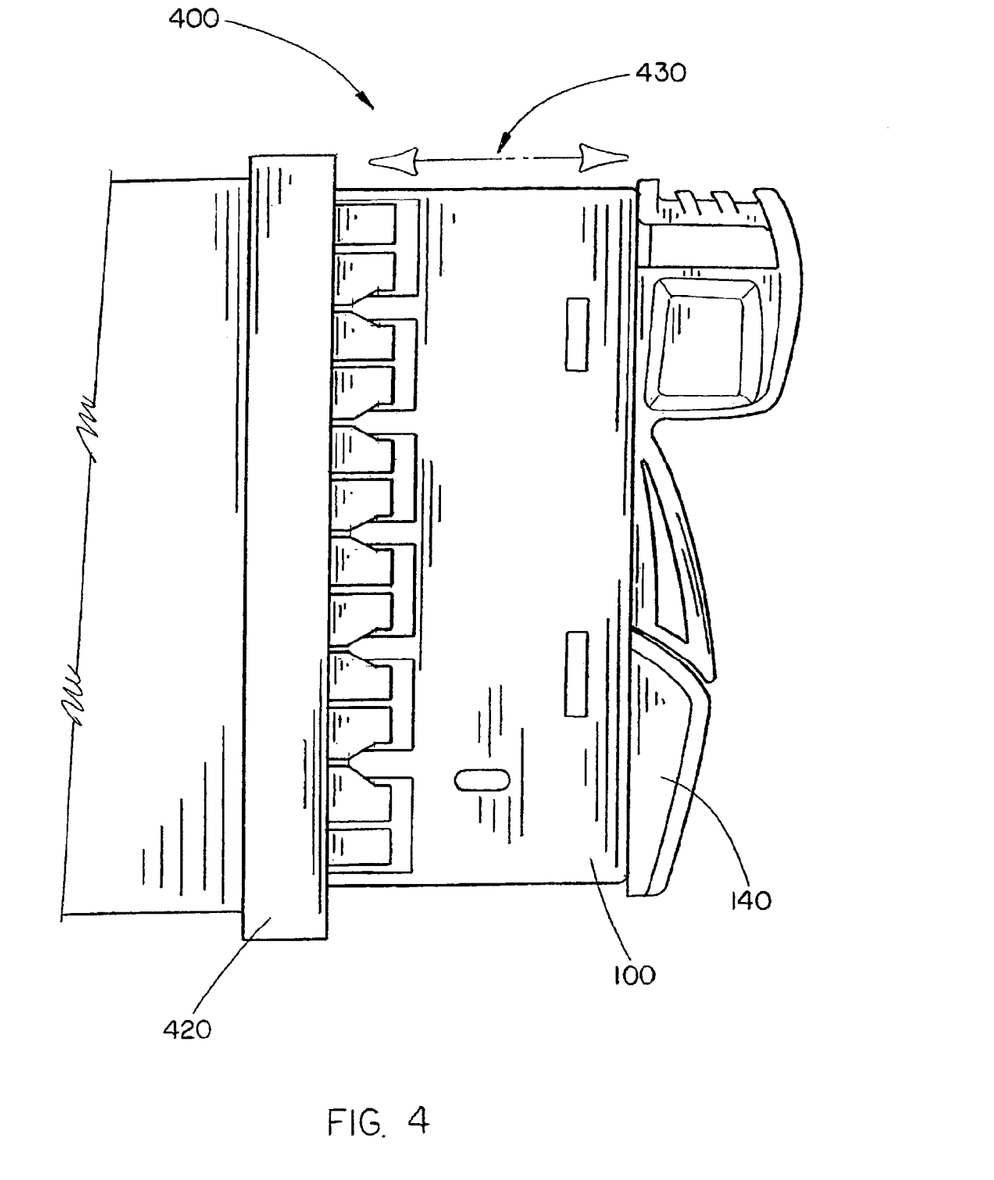
FIG. 4 is an illustration of an exemplary embodiment of the present invention wherein RDA of FIGS. 1A-1D is shown improperly seated within the RAID storage shelf and indicating the linear movement capabilities of RDA within the RAID storage shelf.
Figure 5A:
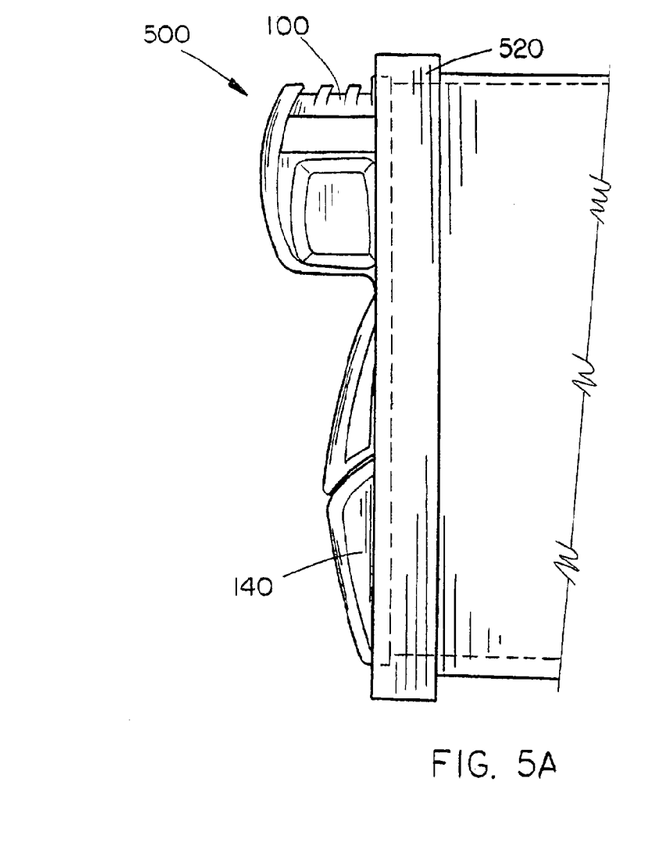
FIG. 5A is an isometric view illustrating an exemplary embodiment of the present invention wherein RDA of FIGS. 1A-1D is shown improperly seated within the RAID storage shelf and the indicator is fully exposed.
Figure 5B:
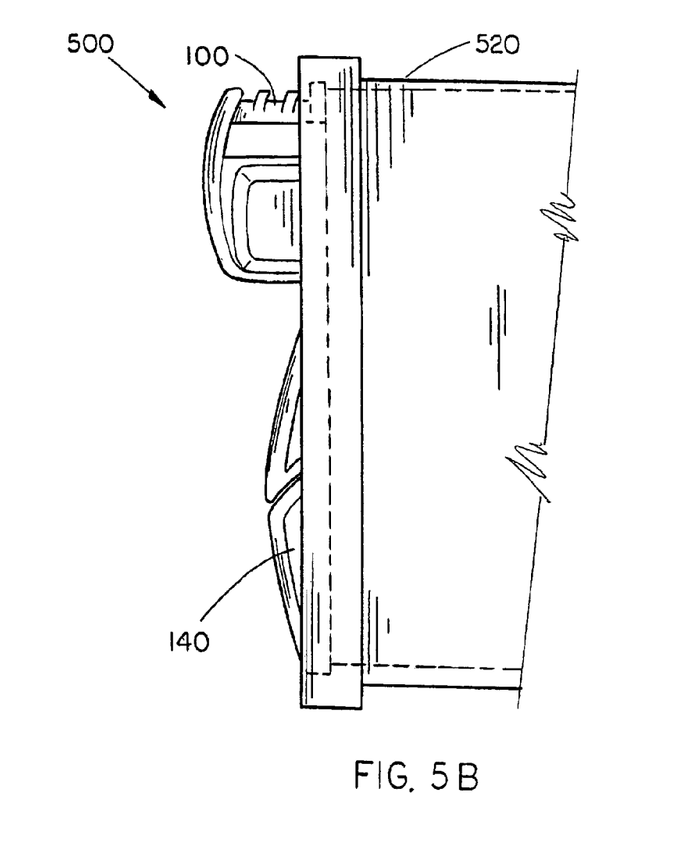
FIG. 5B is an isometric view illustrating an exemplary embodiment of the present invention wherein RDA of FIGS. 1A-1D is shown improperly seated within the RAID storage shelf and the indicator is partially exposed.

RAID storage shelf 220 may contain "Throw" levers. These throw levers may be attached to the shelf and direct the seating of RDA 100 units being seated within RAID storage shelf 220. There may be a throw lever attached for each RDA 100 unit that can be seated within RAID storage shelf 220. A user may manually operate the throw lever, which provides rotational motion. The rotational motion of the throw lever initiates the linear travel of RDA 100 units within RAID storage shelf 220. The width of the indicator may correspond to the distance of linear movement the throw lever may provide to the component. Further, this distance of linear movement may be the distance required for proper seating of RDA 100 units within RAID storage shelf 220. Thus, until a user has fully exhausted the linear motion provided by the throw lever, RDA 100 will not be properly seated and the indicator will remain visually ascertainable. FIGS. 4, 5A and 5B illustrate this linear movement and indicator ascertainment.

Storage system enclosures may have a physical profile as a RAID storage shelf, tower storage apparatus, rack-mount storage apparatus, desktop storage apparatus and the like. As mentioned before the rigidity of the storage system enclosure may act to provide multiple mounting capabilities and it may even be aesthetically designed to blend in color and form with its surroundings or with the drives it contains within. These storage system enclosures may include seven to fourteen hard disk drives. Storage system enclosures may come in a variety of structures such as a RAID storage shelf, just a bunch of disks (JBOD) and the like without departing from the spirit and scope of the present invention. Each system may be structured to provide functionality in a particular way. For instance, the communication channels used within the system may include standard computer cable channels, fibre channels, fibre-optic channels and the like. Access and control of these systems may be through controllers (e.g., filer heads, etc. . . . ) which may utilize SCSI controller commands, a SCSI-3 enclosure services command set or other command languages as may be contemplated by one of ordinary skill in the art. Further, the system may serve a specific utility such as providing extended data availability and protection (EDAP) through internal structuring which enables functioning of the assembly as a mirrored disk system, mirroring RAID system, parity RAID system and the like.

The filer head, mentioned above, may be an information handling system that specializes in storing and serving data on RAID storage shelves. One filer head may operate multiple RAID storage shelves. RAID storage shelf controllers may be storage assembly controllers and other devices known and used by persons of ordinary skill in the art. These control devices may allow information to flow into and out of the RAID storage shelf via the drive components within the shelf.

Figure 3:
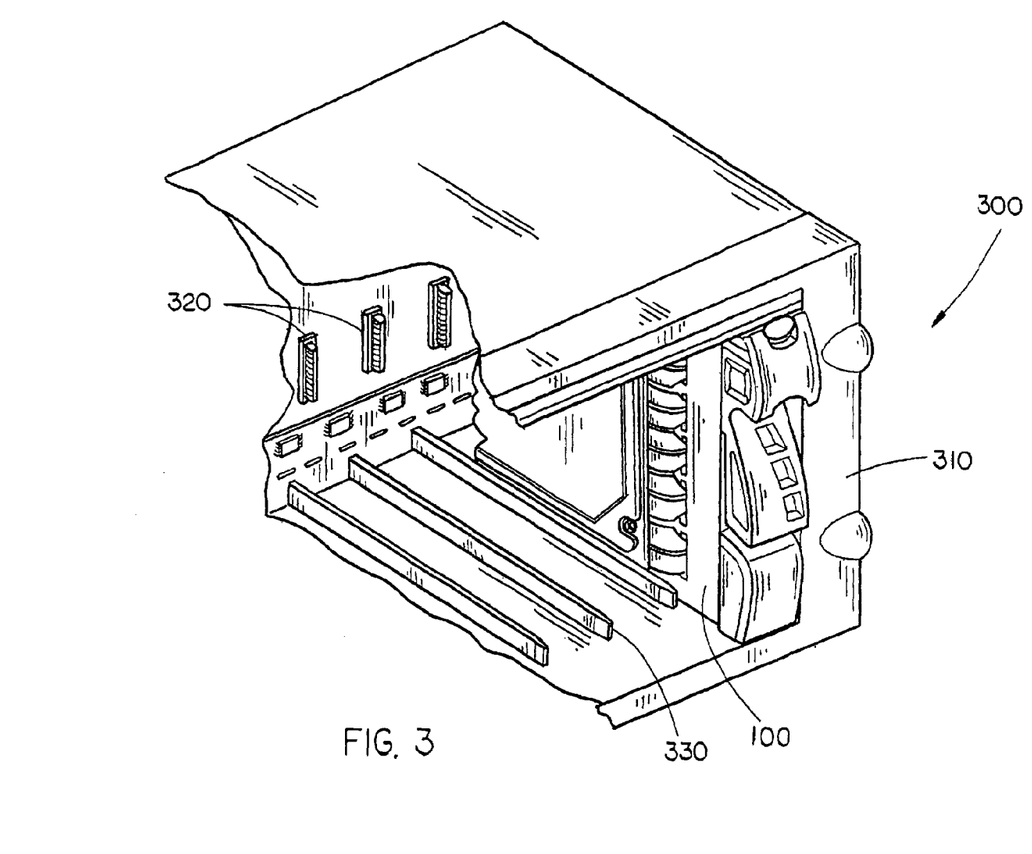
FIG. 3 is a cut away isometric view illustrating an exemplary embodiment of the present invention wherein the RAID storage shelf includes a communication port adapter.

FIG. 3 illustrates a RAID storage shelf 310 including a communication port adapter 320 in embodiment 300. RAID storage shelf 310 has an internal bottom side, internal top side, internal right side and internal back side. The communication port adapter is included on the internal back side in a location, which will enable a coupling of the communication port adapter on the RDA 100 with the one on RAID storage shelf 310. Contained upon the internal bottom side of RAID storage shelf 310 is an apparatus for providing insertion slots of individual RDA 100 units. In the present embodiment the apparatus are individual runner boards 330, which function to delineate the separate seating positions. The inside surface of RAID storage shelf 310 is of a tactile material such as steel. This protects the devices within and provides a smooth insertion surface.

The communication port adapter may include a parallel port, special connector and other such mechanisms of communicative coupling as may be contemplated by one of ordinary skill in the art. This communication port adapter provides for a communicative coupling between RDA 100 and RAID storage shelf 310, which may allow peripheral devices access to the information stored on the hard disc drive through a network system. Further, it may indicate that RDA 100 is correctly seated within RAID storage shelf 310. The location of the communication port adapter disposed on RAID storage shelf 310 in the present embodiment is exemplary. It is contemplated that the communication port adapter may be disposed in a location that is customary for normal usage of these types of storage system enclosures. The number of the communication port adapters included within a storage system enclosure is a function of the system specifications and may be at least one or more.

The runner boards 330 may be composed of materials such as steel, aluminum, plastic and the like. They may be low-profile, as shown in the current embodiment, or they may be high profile extending a greater height up the interior of RAID storage shelf 310, possibly even extending from the inside bottom to the inside top of RAID storage shelf 310. It is contemplated that RAID storage shelf 310 may not contain any runner boards 330. Runner boards 330 may be attached by a variety of fastening means such as screws, pins, bolts, compression snaps and the like.

The inside surface of RAID storage shelf 310 may be composed of materials such as plastic, aluminum and the like, so long as they are capable of providing a smooth surface. It may be that the inside surface is of a material that is conducive to heat dispersion, which may be beneficial if the RAID storage shelf 310 is prone to heat build up.

Referring to FIG. 4, RDA 100 is shown in a received position within RAID storage shelf 420. This illustration 400 represents RAID storage shelf 420 (as described in FIGS. 2 and 3), which allows for the insertion and removal of elements, such as RDA 100 (as described in FIGS. 1A-1D), and is indicating the physical movement capabilities 430 of RDA 100 within RAID storage shelf 420. Indicator 140 is fully exposed indicating that RDA 100 is not properly seated.

This capability to insert securely and remove individual components may allow the storage system to perform "Hot Swapping" (as described in FIG. 1) of its individual elements but may also present the situation where the individual element is not properly seated in and engaged within the storage system. There may be situations where such an easy visual identification might not be available, as discussed in FIG. 5 below.

An improperly seated RDA 100 is shown in FIGS. 5A and 5B. The embodiment 500 of the present invention shows RDA 100 is incorrectly seated, in two orientations, within a RAID storage shelf 520. Each illustration depicts the exposed left side of RDA 100 with indicator 140 attached.

Illustration of FIG. 5A shows RDA 100 in a nearly fully exposed seating position within RAID storage shelf 520. Phantom lines indicate the positioning of RDA 100 with respect to RAID storage shelf 520. In this position indicator 140 is visually ascertained almost in its entirety. Thus, an operator may be visually capable of identifying that RDA 100 is improperly seated within RAID storage shelf 520. In a RAID storage shelf with a throw lever (described in the discussion of FIG. 2) a user may ascertain that the throw lever has not exhausted its rotational movement capabilities. As such there remains some capacity in this system for RDA 100 to make some linear movement either by rotationally engaging the throw lever or by a more direct physical exertion means.

Illustration FIG. 5B shows RDA 100 in a partially exposed seating position within the RAID storage shelf. In this position indicator 140 is partially exposed. Though partially covered by the RAID storage shelf 520, indicator 140 may be visually ascertained by an operator. Thus, the operator may be visually capable of identifying that RDA 100 is incorrectly engaged and seated within RAID storage shelf 520. There may remain some capacity for linear movement by RDA 100 in this system. The throw lever may have some rotational capabilities, which would produce the linear movement needed or a user may apply a more direct physical exertion means.

Figure 6A:
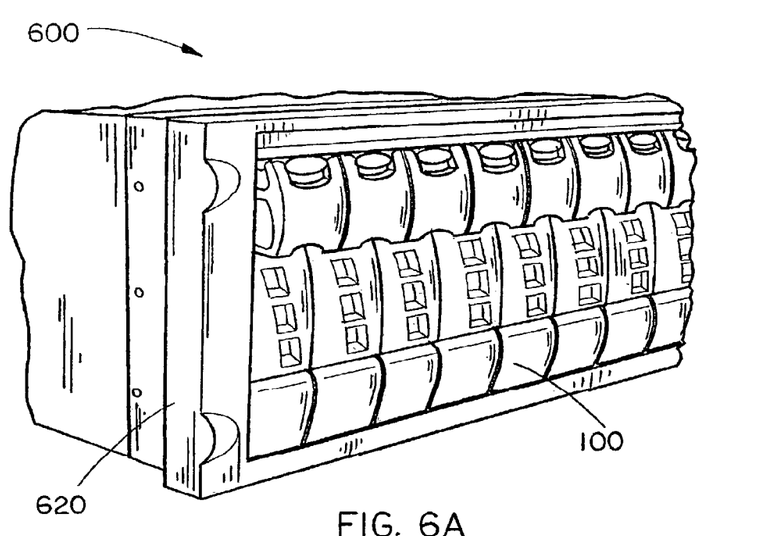
FIG. 6A is an isometric view illustrating an exemplary embodiment of the present invention wherein a RAID storage shelf is shown, in a horizontal position, with all RDA units properly seated.
Figure 6B:
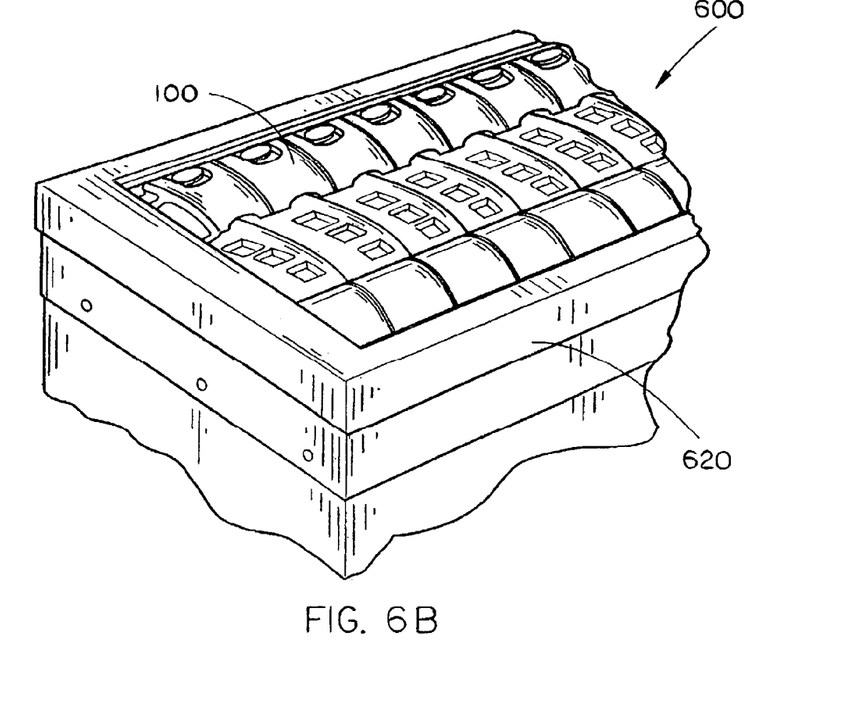
FIG. 6B is an isometric view illustrating an exemplary embodiment of the present invention wherein a RAID storage shelf is shown, in a vertical position, with all RDA units properly seated.

Referring to FIGS. 6A and 6B a properly seated and engaged RDA 100 is shown. Embodiment 600 of the present invention shows that RDA 100 (as shown in FIGS. 1A-1D) is correctly engaged and seated within a RAID storage shelf 620 (as described in FIGS. 2 and 3). The illustration of FIG. 6A shows RAID storage shelf 620 in a horizontal position. RAID storage shelf 620 contains multiple RDA 100 units properly seated. RDA 100 units are flush across the front with the handle of the top area of the front portion protruding beyond the edge of RAID storage shelf 620. Indicator 140 is not visible on any RDA 100 units. In this positioning of RDA 100 units it may be recognized that they are properly seated and engaged, thus, communicatively coupled with RAID storage shelf 620 and therefore, may be communicatively connected with a user interface and available to the user.

The illustration of FIG. 6B shows RAID storage shelf 620 in a vertical position. RDA 100 units are properly seated and flush across their fronts as previously discussed. As a result, it may be seen that indicators 140, located on RDA 100 units are not visually ascertainable by a person of ordinary visual capabilities. In this positioning of RDA 100 units it may be recognized that they may be communicatively coupled with RAID storage shelf 620 and therefore, may be communicatively connected with a user interface and available to the user.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An apparatus for indicating whether a drive is properly seated in a drive cage, comprising:

a carrier attached to the drive for transporting the drive, the carrier composed of tactile magnesium and further comprising a front portion and an exposed front side, the front portion being a first color;

an indicator attached to each lateral side of the carrier positioned to correspond with at least one of a lower first or a lower second side of the exposed front side of the front portion of the carrier and being a second color different from the first color of the front portion of the carrier; and a throw lever, the width of the indicator, at a widest point, corresponding to the length of linear travel imparted through the use of the throw lever, wherein the second color is not visible once the drive is properly seated in the drive cage.

2. The apparatus of claim 1, wherein the drive comprises a hard disc drive.

3. The apparatus of claim 1, wherein the drive cage comprises a redundant array of independent disks storage shelf.

4. The apparatus of claim 1, wherein the indicator is exposed when the drive is improperly seated.

5. The apparatus of claim 1, wherein the indicator is not exposed when the drive is properly seated.

6. The apparatus of claim 1, further comprising:

a first communication port adapter, disposed on the drive cage; and a second communication port adapter, disposed on the drive, the second communication port adapter being capable of mechanically coupling with the first communication port adapter, wherein the mechanical coupling of the first and second communication port adapters provides the correct engagement of the drive, within the drive cage.

7. An apparatus for indicating proper seating, comprising:

a drive suitable for being seated within a drive cage;

a carrier composed of tactile magnesium attached to the drive for transporting the drive, the carrier further comprising a front portion and an exposed front side, the front portion being a first color;

an indicator for indicating when the drive is properly seated in the drive cage, the indicator further comprising at least two lateral sides positioned to correspond with a lower first and a lower second side of the exposed front side of the front portion of the carrier, each of the at least two lateral sides being a second color contrasting with the first color of the front portion of the carrier; and a throw lever, the width of the indicator, at a widest point, corresponding to the length of linear travel imparted through the use of the throw lever, wherein the drive is a hot swappable drive, and the second color is not visible once the drive is properly seated in the drive cage.

8. The apparatus of claim 7, wherein the drive is mounted with the carrier and the indicator is attached to the carrier.

9. The apparatus of claim 8, wherein the drive comprises a hard disc drive.

10. The apparatus of claim 7, wherein the drive cage comprises a redundant array of independent disks storage shelf to which the indicator is attached.

11. The apparatus of claim 7, wherein the indicator is visually ascertainable when the drive is not properly seated in the drive cage.

12. A drive assembly, comprising:
a drive suitable for being received in a drive cage, the drive cage including a plurality of runner boards configured to provide delineation between at least two seating positions for the drive;
a carrier attached to the drive for transporting the drive, the carrier composed of tactile magnesium and further comprising a front portion and an exposed front side, the front portion being a first color; and
an indicator attached to at least one lateral side of the carrier positioned to correspond with at least one of a lower first or a lower second side of the exposed front side of the front portion of the carrier a second color different from the first color of the front portion of the carrier; and
a throw lever, the width of the indicator, at a widest point, corresponding to the length of linear travel imparted through the use of the throw lever,
wherein the second color is not visible once the drive is properly seated in the drive cage.

13. The drive assembly of claim 12, wherein the drive is mounted with the carrier and the indicator is attached to the carrier.

14. The drive assembly of claim 12, wherein the drive cage comprises a redundant array of independent disks storage shelf to which the indicator is attached.

15. The drive assembly of claim 13, wherein the drive comprises a hard disc drive.

16. The drive assembly of claim 12, wherein the indicator is visually ascertainable when the drive is not properly seated within the drive cage.

17. The drive assembly of claim 12, further comprising:
a first communication port adapter, disposed on the drive cage; and
a second communication port adapter, disposed on the drive, the second communication port adapter being capable of mechanically coupling with the first communication port adapter,
wherein the mechanical coupling of the first and second communication port adapters provides the correct engagement of the drive, within the drive cage.

18. A drive assembly comprising:
means for seating a drive in a drive cage;
means for engaging the drive with the drive cage; and
means for indicating when the drive has been properly seated in the drive cage,
wherein the seating means includes the drive mounted with a carrier composed of tactile magnesium, the carrier further comprises a front portion, the front portion being a first color and further comprising an exposed front side, the means for indicating when the drive has been properly seated in the drive cage is by an indicator attached to at least one lateral side of the carrier positioned to correspond with at least one of a lower left or a lower right side of the exposed front side of the front portion of the carrier, the indicator being a second color contrasting with the first color of the front portion of the carrier, the means for engaging the drive with the cage includes a throw lever, the width of the indicator, at a widest point, corresponding to the length of linear travel imparted through the use of the throw lever, and the second color is not visible once the drive is properly seated in the drive cage.

19. The drive assembly of claim 18, wherein the seating means includes the drive cage comprising a redundant array of independent disks storage shelf and provides seating for individual drives within.

20. The drive assembly of claim 18, wherein the seating means includes the drive comprising a hard disc drive.

21. The drive assembly of claim 18, wherein said means for engaging the drive with the drive cage further comprises:
a first communication port adapter, disposed on the drive cage; and
a second communication port adapter, disposed on the drive, the second communication port adapter being capable of mechanically coupling with the first communication port adapter,
wherein the mechanical coupling of the first and second communication port adapters indicates correct engagement of the drive, within the drive cage.

22. The drive assembly of claim 18, wherein the means for indicating comprises the indicator being visually ascertainable when the drive is not properly seated in the drive cage.

23. An apparatus for indicating whether a drive is properly seated in a drive cage, comprising:
a removable carrier assembly composed of a tactile magnesium having a contoured shape and a front portion comprising a first color;
an indicator assembly formed in a shape that conforms to the contoured shape of the removable carrier assembly coupled to the removable carrier assembly comprising at least one indicator assembly surface having a second color adhered thereto; and
a throw lever, the width of the indicator, at a widest point, corresponding to the length of linear travel imparted through the use of the throw lever,
wherein the removable carrier assembly includes a plurality of fasteners and is integrated with a removable hard disk drive carrier assembly including a plurality of corresponding fastener points, the second color contrasts with the first color of the front portion of the removable carrier assembly, and at least a portion of the second color is visible when the removable carrier assembly is improperly seated in the drive cage.

24. The apparatus of claim 23, wherein the front portion of the removable carrier assembly further comprises at least one of a translucent exposed portion or a translucent internal structure.

25. The apparatus of claim 23, wherein the application of the second color is accomplished by painting, printing or adhering the second color to the at least one surface of the indicator assembly.

26. An apparatus for indicating whether a drive is properly seated in a drive cage, comprising:
a removable drive suitable for being received in the drive cage, the drive cage including a plurality of runner boards configured to provide delineation between at least two seating positions for the removable drive, the removable drive composed of tactile magnesium, having a contoured shape and further comprising a front portion and an exposed front side, the front portion being a first color;

an indicator assembly formed in a shape that conforms to the contoured shape of the removable drive for indicating when the removable drive is properly seated in the drive cage, the indicator assembly further comprising at least two lateral sides positioned to correspond with a lower first and a lower second side of the exposed front side of the front portion of the removable drive, each of the at least two lateral sides being a second color contrasting with the first color of the front portion of the removable drive, at least one of the at least two lateral sides having the second color adhered thereto; and a throw lever, the width of the indicator, at a widest point, corresponding to the length of linear travel imparted through the use of the throw lever, wherein the second color is not visible once the removable drive is properly seated in the drive cage, the removable drive is a hot swappable drive, and includes a plurality of fasteners, and the drive cage includes a plurality of corresponding fastener points configured to integrate with the plurality of fasteners.

* * * * *